United States Patent [19]
Phillips et al.

[11] Patent Number: 5,450,268
[45] Date of Patent: Sep. 12, 1995

[54] METHOD AND APPARATUS FOR RMS CURRENT APPROXIMATION

[75] Inventors: Timothy B. Phillips, Raleigh, N.C.; Antoine D. Stentz, Paris, France

[73] Assignee: Square D Company, Palatine, Ill.

[21] Appl. No.: 104,747

[22] Filed: Aug. 11, 1993

[51] Int. Cl.[6] .............................................. H02H 3/26
[52] U.S. Cl. ........................................ 361/93; 361/79; 361/18
[58] Field of Search ................... 361/78, 79, 85, 93, 361/87, 18

[56] References Cited

U.S. PATENT DOCUMENTS

| | | | |
|---|---|---|---|
| 3,573,604 | 4/1971 | Lundgreen | 361/18 |
| 4,345,288 | 8/1982 | Kampf et al. | 361/31 |
| 4,658,323 | 4/1987 | Dougherty | 361/79 |
| 5,220,478 | 6/1993 | Innes et al. | 361/93 |

*Primary Examiner*—Marc S. Hoff
*Assistant Examiner*—S. Jackson
*Attorney, Agent, or Firm*—Michael J. Femal; Richard J. Graefe; Larry I. Golden

[57] ABSTRACT

A method and apparatus provides for a measurement technique which approximates the true rms value of a current waveform. The technique involves converting the current waveform to a voltage by rectification and determining the peak value and the average value of the resultant voltage. A summing circuit combines the two values at a predetermined ratio to create a DC voltage that is approximately equal to the rms value of the input currents. The DC voltage output is suitable for a wide range of applications. A combination of the approximation circuit with a time integrating circuit and a level detecting circuit produces a low cost solid state overload relay in a preferred embodiment of the invention. Other uses include metering and use as a current feedback control signal for controlling PWM inverters and the like.

20 Claims, 5 Drawing Sheets

METHOD AND APPARATUS FOR RMS CURRENT APPROXIMATION

TECHNICAL FIELD

Applicant's invention relates generally to the conversion and measurement of the current of an electrical load, and more particularly to an apparatus that will produce a signal proportional to the rms current of the load.

BACKGROUND ART

Many methods have been utilized to measure the AC current flowing to a load. These methods are used as part of more complex devices such as solid state breakers or overload relays, AC line monitoring devices, or current feedback control loops as required for motor drives and power supplies. The application usually determines the degree of measurement accuracy required. Root-mean-square (rms) current is generally considered to be an accurate representation of the actual current flowing in the circuit being monitored. For simple systems, this may not be necessary and instead, average current over a set time period, usually one cycle, is used to represent the actual current. Other systems will use peak current over the same time period as the basis. More sophisticated microprocessor based devices will actually compute the rms value by sampling the current waveforms many times during each time period, and using those sample measurements to generate the value of the current over the time period.

Using a solid state overload relay as an example of one such application, a common method used to generate a signal representative of the line current is to use a peak detecting circuit as disclosed in commonly assigned U.S. Pat. No. 4,345,288. Although this device provides a close approximation of a standard thermal electromechanical overload unit, the device does not compensate for non-sinusoidal currents that may be encountered in some instances. Likewise, line harmonics and transients may cause erroneous results. A microprocessor based device to accomplish a similar function is outlined in U.S. Pat. No. 5,220,478 which will compute the rms current through digital sampling techniques. Whereas this is a more accurate method, it is a relatively expensive solution because of the increased component requirements for support circuitry and the increase in the size of the device to house the extra components. For a low cost application where size is also a factor, it would be desirable to provide a solid state overload relay that computes an approximation of the rms current without the complexity of a microprocessor based device.

SUMMARY OF THE INVENTION

Accordingly, the principal object of the present invention is to provide a method and apparatus for the conversion of the current of a polyphase electrical load to a signal proportional to the RMS current of the load.

A further objective of the invention is to provide an overload relay function employing the method and apparatus of current conversion of the present invention.

Yet a further objective of the invention is to provide a method and apparatus for providing a current feedback signal of a load proportional to the rms current of the load.

Another objective of the invention is to provide a method and apparatus for monitoring the current of a load by providing a signal proportional to the rms current of the load.

In the preferred embodiment of the invention, conventional current transformers sense the current flow in each phase of the load. The load typically could be a single or three phase motor. The current transformers generate an output current signal that is proportional in magnitude to the sensed current. This output is coupled to a current to voltage converter circuit to create a voltage that is also proportional in magnitude to the sensed current. This voltage signal is applied to two circuits connected in parallel, one to measure the peak value of the voltage and the other to measure the average value of the voltage over one cycle of the applied AC voltage. The outputs of both of these circuits are connected together at a summing junction through different valued resistors of a buffer amplifier. These different resistance values at the input to the summing point serve as to provide different weighting factors to the two signals to produce a composite voltage signal. This signal will be a DC level, which for a sinusoidal current, closely approximates a scaled rms value of the original input load current. For the common non-sinusoidal current waveforms encountered in most applications, this circuit will retain its accuracy to within a ±5% of the true rms value.

For a current monitoring function, this output can be easily converted and scaled to a digital representation of the load current and visually displayed. To provide an overload or circuit breaker function, this output is fed to a time integrating circuit to produce various trip curves, the output of which is compared with a predetermined trip reference voltage signal. When this output exceeds this level, the overload or breaker will trip, providing an output contact or contacts that will change state when this does occur.

Various power conversion devices such as PWM inverters require a current feedback signal representative of the load current as a controlling element of the device for current limit control. The output voltage of the present invention can provide this function by utilizing this output, with proper scaling factors, as an input to the inverter as the current feedback signal which is proportional to the rms current of the load.

Other features and advantages of the invention, which are believed to be novel and non-obvious, will be apparent from the following specification taken in conjunction with the accompanying drawings in which there is shown a preferred embodiment of the invention. Reference is made to the claims for interpreting the full scope of the invention which is not necessarily represented by such embodiment.

DETAILED DESCRIPTION

Although this invention is susceptible to embodiments of many different forms, a preferred embodiment will be described and illustrated in detail herein. The present disclosure exemplifies the principles of the invention and is not to be considered a limit to the broader aspects of the invention to the particular embodiment as described.

Figure 1:
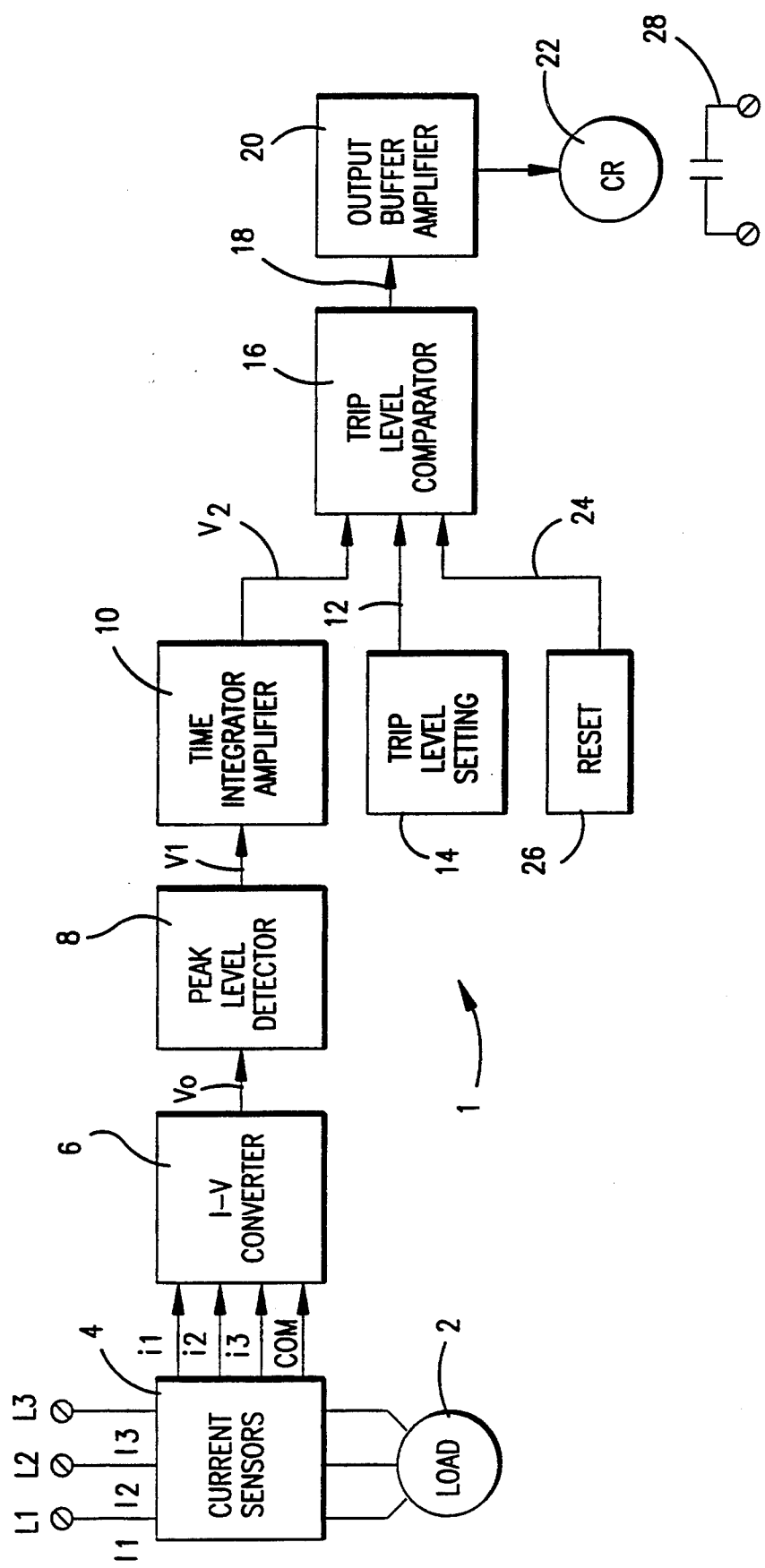
FIG. 1 is a diagram of a typical prior art solid state overload relay (SSOLR).

FIG. 1 illustrates a typical solid state overload relay protective device 1 representative of prior art. A circuit breaker function would be similar. Three phase incoming power L1-L3 is fed to a load 2. The load could be lighting equipment, heating equipment or inductive loads such as motors, magnets, brakes or coils. Current sensors 4 monitor the load currents l1-l3 to create currents i1-i3 respectively which are proportional in magnitude to the sensed currents. The current sensors 4 generally are current transformers. A current to voltage converter 6 transforms the three currents i1-i3 to an output voltage Vo that is proportional to a composite of the sum of the three currents. The resulting voltage Vo is mostly DC with about a 10% ripple for balanced sinusoidal currents. A peak detecting circuit 8, typically consisting of a diode and a capacitor, will capture the peaks of the ripple voltage Vo to generate a voltage V1 which will be a DC voltage that is proportional to the peak current of the load 2. The overload relay function is time based and not instantaneous. The greater the magnitude of the overload, the faster the overload relay must trip out. Therefore, time integrator amplifier 10 will integrate voltage V1 to create a voltage V2 which has an inverse time relationship with the magnitude of the sensed currents l1-l3. Voltage V2 is an exponential response to the input voltage V1. When an overload condition arises, V2 will start ramping up above a level that represents the 100% current rating of the overload relay. To create the overload trip curve, a voltage 12, as set by trip level setting circuit 14 is computed such that the output of the time integrator amplifier 10 will reach this voltage level 12 if the overload condition exists for a predetermined amount of time. For instance, if the overload condition is at 600% of the rated load, this time might be set at 10 seconds and be set at 200 seconds if the overload is at 200% of the load. Trip level comparator 16 will compare voltage V2 with this predetermined voltage 14 and will output a signal 18 that will energize control relay 22 through output amplifier 20 once voltage V2 exceeds set level voltage 14. Comparator 16 will function as a schmidt trigger in that once this comparison has been exceeded, the output 18 will remain in the tripped state until output V2 has decayed below a second predetermined reset level 24 and the reset 26 is activated, either manually or automatically. Contacts 28 from relay 22 are used to disconnect the power L1-L3 from the load, the details of which are well known, when the overload relay has tripped.

Figure 2:
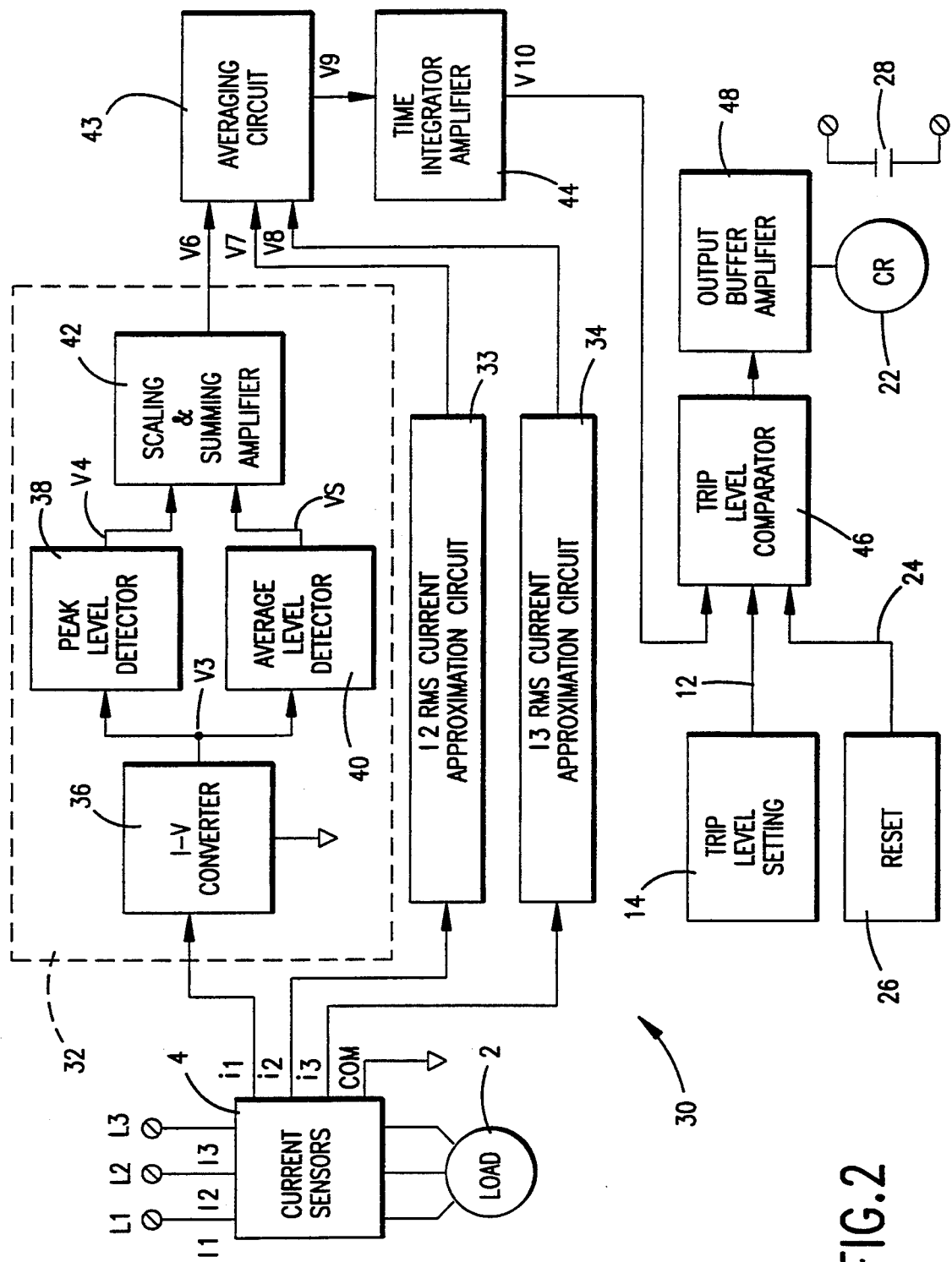
FIG. 2 is a schematic block diagram of a SSOLR utilizing a system for converting the load current to an approximation of the rms value of the current according to the present invention.

Referring to FIG. 2, an improved solid state overload relay 30 is detailed utilizing a system for converting the load currents L1-L3 to an approximation of the rms value of the current according to the present invention. Although a three phase system is disclosed, it is to be understood that a single phase or polyphase system would function in a similar manner. As discussed above, three phase incoming power L1-L3 is fed to a load 2. Current sensors 4 monitor the load currents l1-l3 to create the proportional currents i1-i3, respectively. Each of the currents i1-i3 is independently processed by an rms current approximation circuit 32-34, the object of the present invention. Current i1 is converted to a voltage V3 by an I-V converter 36. V3, which is proportional to the load current l1, is divided into two paths, one to a peak level detecting circuit 38 and the other to an average level measuring circuit 40. Peak level detecting circuit 38 will capture the peaks of the ripple voltage V3, generating a voltage level V4. Average level measuring circuit 40 generates a voltage V5 which will be a DC voltage that is proportional to the average current of the load 2. V4 and V5 are inputted to scaling and summing amplifier 42 which generates a voltage V6 which is a proportional rms approximation of the sensed line current l1.

It has been empirically determined that an accurate approximation of the line current can be attained based on the equation:

$$I_{rms} = 0.22 * I_{pk} + 0.766 * I_{ave}$$

where: $I_{rms}$ is the root mean square current, $I_{pk}$ is the peak value of current, and $I_{ave}$ is the average value of current.

Scaling and summing amplifier 42 solves this equation to create the DC output voltage V6 which is proportional to rms value of the line currents L1-L3. For most non-sinusoidal currents, a ±5% accuracy for the approximation can be attained. This compares with a 30% accuracy common for traditional systems based on a peak detecting method.

Likewise, rms current approximation circuits 33 and 34, which are identical with circuit 32, will generate output voltages V7 and V8. The output voltages V6-V8 are fed to an averaging circuit 43 which will combine them to create a composite DC voltage V9 which is proportional to the average of the three rms phase currents l1, l2 and l3. V9 is inputted to time integrator circuit 44 which, along with the trip level comparator 46, and output buffer amplifier 48 provides the timing function and output relay contacts as previously discussed for the overload relay function and is identical with the system disclosed above. For a single phase system, only rms current approximation circuit 32 is required and output voltage V6 is fed directly to the time integrator circuit 44.

Figure 3:
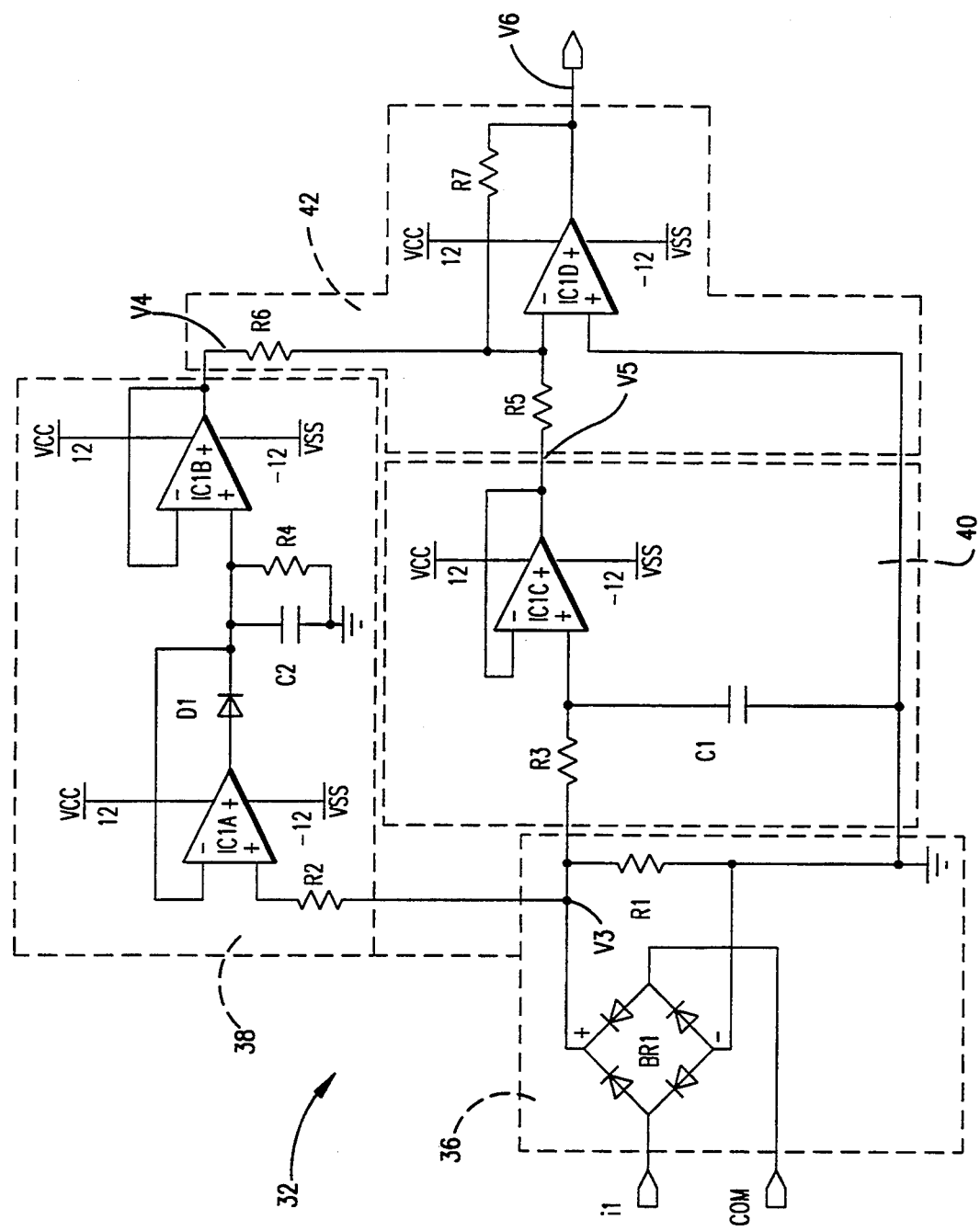
FIG. 3 is a detailed schematic block diagram of the approximation circuit as depicted in FIG. 2.

For the preferred embodiment of the present invention, FIG. 3 details the approximation circuit 32 as depicted in FIG. 2 which comprises the current to voltage converter 36, the peak level detecting circuit 38, the average level measuring circuit 40, and the scaling and summing amplifier 42. As previously mentioned, approximation circuits 33-34 are identical to circuit 32. Load currents L1-L3 are monitored by current transformers in each of the three phase conductors. The secondaries of the current transformers produce currents i1, i2, and i3. Currents i1-i3 are reduced in magnitude based on the turns ratio of the current transformers. Each phase current is measured separately by the current to voltage converter circuit 36 in each of the approximation circuits 32-34. Bridge rectifier BR1 produces a full wave rectified current from i1 to generate a full wave rectified voltage V3 across burden resistor R1. Voltage V3 is divided into two paths, one to peak level detecting circuit 38 through resistor R2 and the other to average level measuring circuit 40 through resistor R3.

The peak detecting circuit 38 consists of a first op amp 1C1A, which together with diode D1 combine to form an ideal diode combination and capacitor C2. The ideal diode combination eliminates a voltage drop normally associated with a standard diode which would result in errors in the output voltage V4. Resistor R4 connected in parallel with C2 provides a discharge path with a long time constant to avoid the circuit from becoming just a sample and hold circuit. C2 has low resistance in its charging path and high resistance in its discharge path so that the voltage across C2 will essentially be proportionally equal to the peak value of the input voltage V3. Op amp 1C1B provides a buffer for output V4 to avoid the input impedance of the next stage from causing an error in the C2 voltage. The output V4 of buffer amp 1C1B thus represents this peak voltage.

A series connected resistor R3 and capacitor C1 combine to form the average level measuring circuit 40. The voltage across C1 will be proportional to the average of the voltage V3. R3 and C1 are scaled to provide this function over the frequency range from 48 Hz to at least 780 Hz. Op amp 1C1C provides a buffer for output V5 to avoid the input impedance of the next stage from causing an error in the C1 voltage. The output V5 of buffer amp 1C1C thus represents the average of the V3 voltage.

Scaling and summing amplifier circuit 42 receives voltages V4 and V5 at a summing junction of op amp 1C1D through resistors R6 and R5 respectively. The values of these resistors along with feedback resistor R7 are calculated such that the output V6 of the summer amplifier 1C1D will be proportional to fractions of the each input V4, V5, so as to solve the equation $I_{rms}=0.22*I_{pk}+0.766*I_{ave}$. Output voltage V6 is a DC voltage which has been empirically determined to be proportional to the rms value of the line currents L1–L3 for sinusoidal currents and having, for most non-sinusoidal currents, an accuracy that is within 5% of the true rms value. For a single phase system, voltage V6 can be directly coupled to time integrator amplifier 44 as disclosed in FIG. 2 to create the improved solid state overload relay previously discussed. For a three phase system, voltage V6 is coupled to the averaging circuit 33 where it is combined with the equivalent voltages V7 and V8 generated by the other two phases to generate the output voltage V9 which is proportional to the average of the three rms phase currents l1–l3. The op amp circuits 1C1A–D are supplied from a dual rail ±12VDC power supply, not shown, but the details of which are well known.

Figure 4:
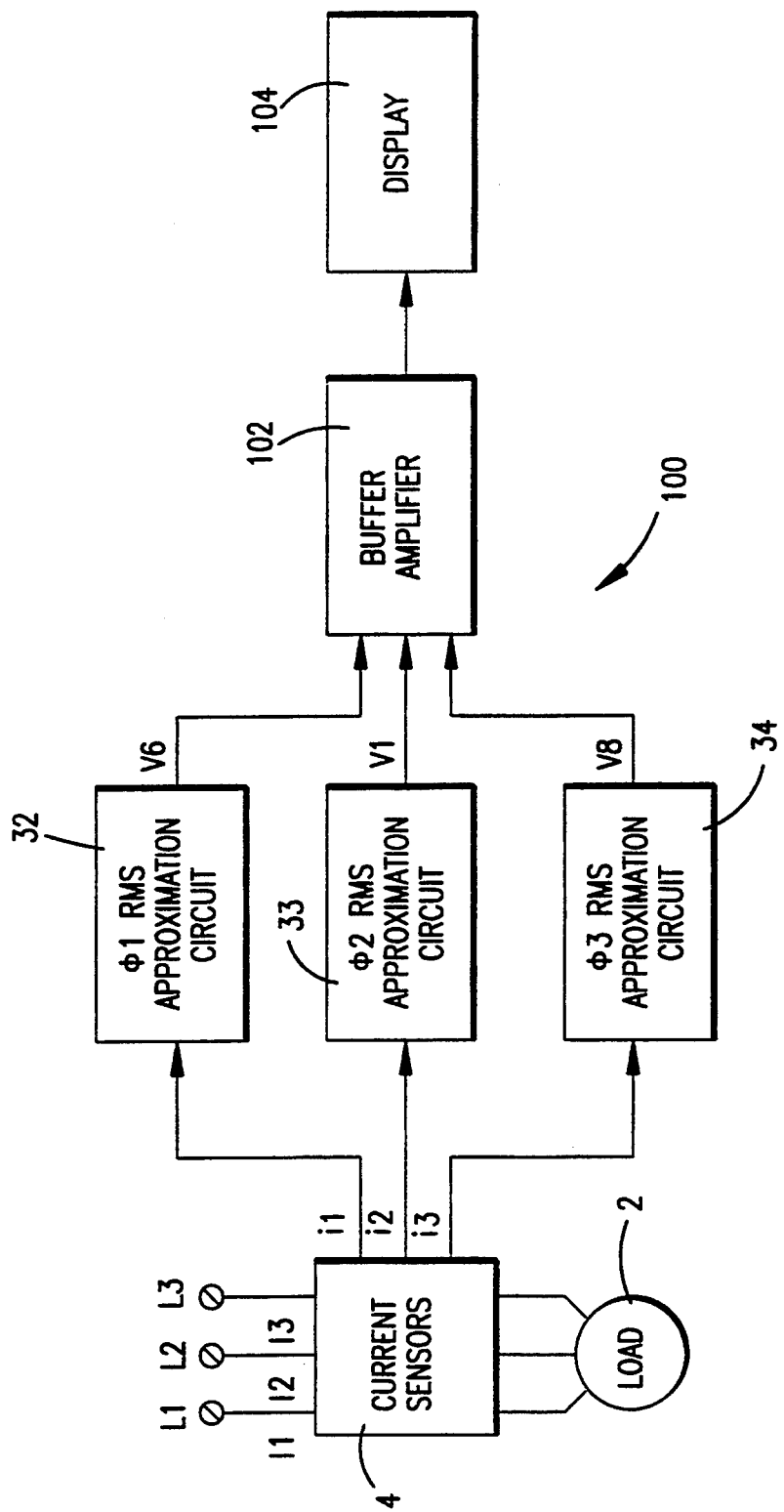
FIG. 4 is a block diagram of a current monitoring device utilizing the system for converting the load current to an approximation of the rms value of the current according to the present invention.

FIG. 4 illustrates a current monitoring device 100 utilizing the rms approximation circuits 32–34. The load currents L1–L3, as before are sensed by current sensors 4 to generate proportion currents i1–i3. The approximation circuits 32–34 will generate voltages V6–V8, as before, for inputting to a buffer amplifier 102 which will in turn drive a display 104 for a visual indication of the rms value of the line currents, either individually or an rms average of the three phase currents. Instead of displaying these currents, buffer amplifier 102 could also input this information to a communications network or other devices whereby information of the line currents is desired.

Figure 5:
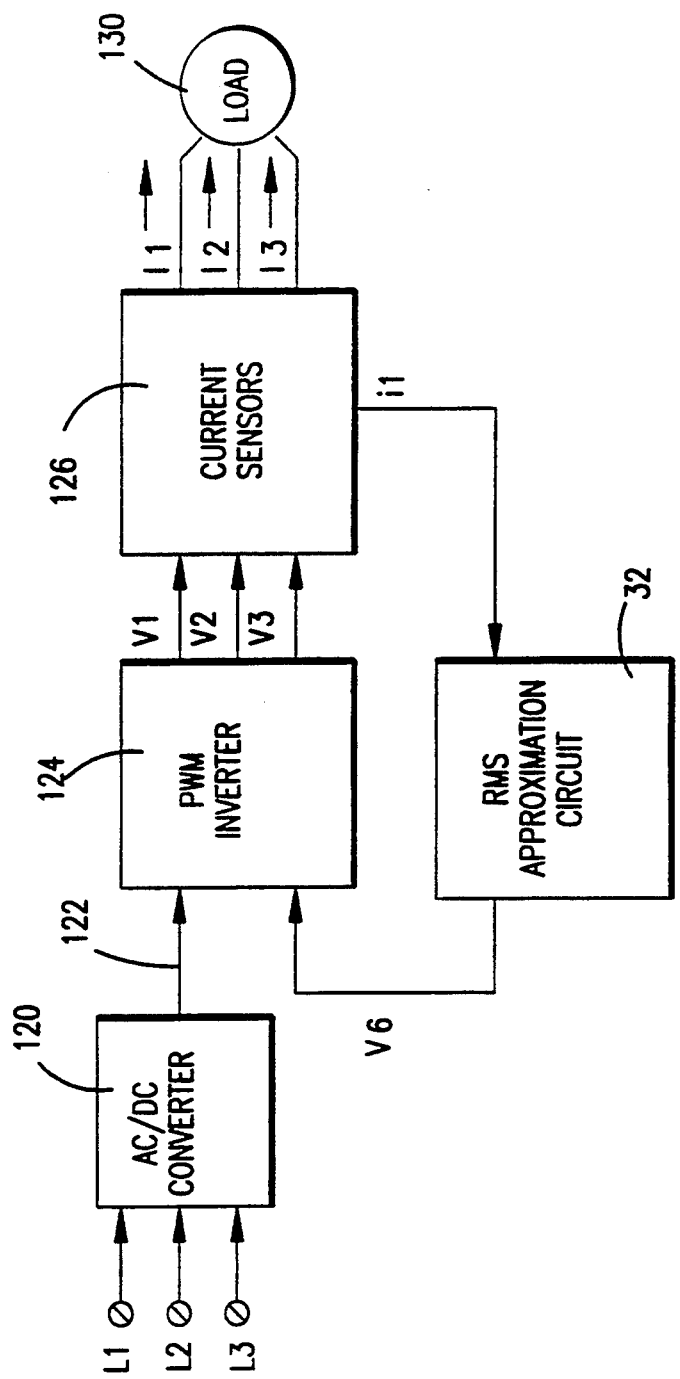
FIG. 5 is a block diagram of a current controlled inverter with a current feedback loop utilizing the system for converting the load current to an approximation of the rms value of the current according to the present invention.

Another use of the rms approximation circuit 32 is depicted in FIG. 5. Current controlled inverters require a current feedback signal to either limit output currents and other control functions. An AC/DC converter will create a DC bus 122 which provides the source of the three phase output voltages. Since the output voltages are pulse width modulated by PWM inverter 124, the output voltages are not sinusodial and the approximation circuit 32 provides a means for converting the load currents to an approximation of the rms value of the current. Although a single phase current signal is shown, three phase monitoring could be used with the addition of rms approximation circuits 32 in the other two phases for controlling the PWM inverter 124.

While the specific embodiments have been illustrated and described, numerous modifications are possible without departing from the scope or spirit of the invention. Although in the foregoing embodiments have been applied to single and three phase systems, it will be clearly understood that the invention is equally applicable to polyphase systems, with the requirement being the addition or subtraction of a separate rms approximation circuit for each phase of the voltage source, adjustments in the time constants of the resistor-capacitor combinations in the peak level detecting and average level detecting circuits, and changes in the averaging circuit that combines the outputs of the rms approximation circuits.

We claim:
1. A method of approximating the rms current of a load supplied power from an AC source comprising:
   a. sensing actual current supplied to said load from said AC source;
   b. converting said actual current to a first voltage proportional to said actual current;
   c. generating a second voltage equivalent to an average value of said first voltage;
   d. generating a third voltage equivalent to a peak value of said first voltage; and
   e. summing a fraction of said second voltage with a fraction of said third voltage to provide an output signal proportional to the rms current supplied to said load from said source.

2. The method of approximating the rms current of claim 1 wherein said AC source is a single phase source.

3. The method of approximating the rms current of claim 1 wherein said AC source is a polyphase source.

4. The method of approximating the rms current of claim 1 wherein said fraction of said second voltage is 22/100 and said fraction of said third voltage is 776/1000.

5. An apparatus for approximating the rms current of a load supplied power from an AC source comprising:
   a. means to sense actual current supplied to said load from said AC source;
   b. means to convert said actual current to a voltage proportional to said actual current;
   c. means to generate a first voltage from said proportional voltage equivalent to an average value of said voltage;
   d. means to generate a second voltage from said proportional voltage equivalent to a peak value of said voltage; and
   e. means to sum a fraction of said first voltage with a fraction of said second voltage to provide an output signal proportional to the rms current of said load.

6. The apparatus for approximating the rms current of claim 5 wherein said AC source is a single phase source.

7. The apparatus for approximating the rms current of claim 5 wherein said AC source is a polyphase source.

8. The apparatus for approximating the rms current of claim 5 wherein said summing means solves an approximation equation to provide said output signal proportional to the rms current of said load.

9. The apparatus for approximating the rms current of claim 5 wherein an approximation equation is equivalent to the equation $$I_{rms} = (0.22 * I_{pk}) + (0.776 * I_{ave})$$

where: $I_{rms}$ is the rms current of said load, $I_{pk}$ is the peak current of said load, and $I_{ave}$ is the average current of said load.

10. A solid state overload protective apparatus for an AC load supplied power from an AC source comprising:
   a. means to sense actual current supplied to said load from said AC source;
   b. means to convert said actual current to a first voltage proportional to said actual current;
   c. means to generate a second voltage from said first voltage, said second voltage proportional to an approximate value equal to the rms current of said load.
   d. means for integrating said second voltage to provide a trip signal representative of a predetermined full load carrying capacity of said AC load;
   e. means for comparing said trip signal with a predetermined trip reference voltage level, said comparator means producing a drive output signal when said trip signal is a lessor magnitude than said trip reference voltage level, and said comparator means producing a turn-off drive output signal when said trip signal is a greater magnitude than said trip reference voltage level indicative of an overload condition; and
   f. means for removing said AC source from said load responsive to said drive output signal when said overload condition exists.

11. The solid state overload protective apparatus of claim 10 wherein said second voltage generating means includes an approximation circuit, said approximation circuit having first means to generate a voltage from said first voltage proportionally equivalent to an average value of said actual current, second means to generate a voltage from said first voltage proportionally equivalent to a peak value of said actual current, and third means to sum a fraction of said voltage from said first means with a fraction of said voltage from said second means to provide said second voltage proportional to the rms current of said load.

12. The solid state overload protective apparatus of claim 11 wherein said approximation circuit solves an approximation equation to provide said output signal proportional to the rms current of said load.

13. The solid state overload protective apparatus of claim 12 wherein said approximation equation to provide said output signal proportional to the rms current of said load is equivalent to the equation $$I_{rms} = (0.22 * I_{pk}) + (0.776 * I_{ave})$$

where: $I_{rms}$ is the rms current of said load, $I_{pk}$ is the peak current of said load, and $I_{ave}$ is the average current of said load.

14. The solid state overload protective apparatus of claim 10 wherein said AC source is a single phase source.

15. The solid state overload protective apparatus of claim 10 wherein said AC source is a polyphase source.

16. An apparatus for approximating the rms current of a load supplied power from an AC source comprising:
   a. means to sense actual current supplied to said load from said AC source;
   b. means to convert said actual current to a first voltage proportional to said actual current;
   c. means to generate a second voltage from said first voltage, said second voltage proportional to an approximate value equal to the rms current of said load; and
   d. wherein said second voltage generating means includes an approximation circuit, said approximation circuit having first means to generate a voltage from said first voltage proportionally equivalent to an average value of said actual current, second means to generate a voltage from said first voltage proportionally equivalent to a peak value of said actual current, and third means to sum a fraction of said voltage from said first means with a fraction of said voltage from said second means to provide said second voltage proportional to the rms current of said load.

17. The apparatus of claim 16 wherein said approximation circuit solves an approximation equation to provide an output signal proportional to the rms current of said load, said approximation equation is equivalent to the equation $$I_{rms} = (0.22 * I_{pk}) + (0.776 * I_{ave})$$

where: $I_{rms}$ is the rms current of said load, $I_{pk}$ is the peak current of said load, and $I_{ave}$ is the average current of said load.

18. The apparatus of claim 16 wherein said AC source is a polyphase source.

19. The apparatus of claim 16 wherein an output signal is inputted to a current monitoring device for providing a visual display of said rms current of said load.

20. The apparatus of claim 16 wherein said output signal is inputted to a pulse width modulator of a DC to AC power inverter for providing a current feedback loop for said DC to AC power inverter, said DC to AC Dower inverter functioning as said AC source.

* * * * *